ized Patent

(12) United States Patent
Lutley

(10) Patent No.: US 6,580,291 B1
(45) Date of Patent: Jun. 17, 2003

(54) HIGH VOLTAGE OUTPUT BUFFER USING LOW VOLTAGE TRANSISTORS

(75) Inventor: James W. Lutley, Southampton (GB)

(73) Assignee: Cypress Semiconductor Corp., San Jose, CA (US)

( * ) Notice: Subject to any disclaimer, the term of this patent is extended or adjusted under 35 U.S.C. 154(b) by 171 days.

(21) Appl. No.: 09/740,193

(22) Filed: Dec. 18, 2000

(51) Int. Cl.[7] .............................................. H03K 17/082
(52) U.S. Cl. ............................. 326/81; 326/83; 326/63
(58) Field of Search ............................... 326/80, 81, 83, 326/86, 63, 68

(56) References Cited

U.S. PATENT DOCUMENTS

| | | | |
|---|---|---|---|
| 4,161,663 A | 7/1979 | Martinez ...................... 307/264 |
| 4,675,557 A | 6/1987 | Huntington .................. 307/475 |
| 4,678,950 A | 7/1987 | Mitake ........................ 307/550 |
| 4,709,162 A | 11/1987 | Braceras et al. ............. 307/270 |
| 4,717,846 A | 1/1988 | Ando .......................... 307/473 |
| 4,782,250 A | 11/1988 | Adams et al. ............... 307/473 |
| 4,800,303 A | 1/1989 | Graham et al. .............. 307/450 |
| 4,963,766 A | 10/1990 | Lundberg .................... 307/451 |
| 5,057,715 A | 10/1991 | Larsen et al. ................ 307/451 |
| 5,151,619 A | 9/1992 | Austin et al. ................ 307/473 |
| 5,160,855 A | 11/1992 | Dobberpuhl ................. 307/270 |
| 5,243,236 A | 9/1993 | McDaniel .................... 307/443 |
| 5,266,849 A | 11/1993 | Kitahara et al. ............. 307/475 |
| 5,300,835 A | 4/1994 | Assar et al. ................. 307/475 |
| 5,319,259 A | 6/1994 | Merrill ........................ 307/443 |
| 5,338,978 A | 8/1994 | Larsen et al. ................ 307/443 |
| 5,381,056 A | 1/1995 | Murphy ....................... 326/21 |
| 5,381,061 A | 1/1995 | Davis .......................... 326/57 |
| 5,387,826 A | 2/1995 | Shay et al. ................... 326/21 |
| 5,396,128 A | 3/1995 | Dunning et al. ............. 326/68 |
| 5,440,249 A | * 8/1995 | Schucker et al. ............ 326/81 |
| 5,444,397 A | 8/1995 | Wong et al. ................. 326/81 |
| 5,450,025 A | 9/1995 | Shay .......................... 326/81 |
| 5,451,889 A | 9/1995 | Heim et al. ................. 326/81 |
| 5,467,031 A | 11/1995 | Nguyen et al. .............. 326/81 |
| 5,512,844 A | 4/1996 | Nakakura et al. ........... 326/81 |
| 5,543,733 A | 8/1996 | Mattos et al. ............... 326/81 |
| 5,574,389 A | 11/1996 | Chu ............................ 326/81 |
| 5,576,635 A | 11/1996 | Partovi et al. .............. 326/27 |
| 5,646,809 A | 7/1997 | Motley et al. .............. 361/56 |
| 5,684,415 A | * 11/1997 | McManus .................... 326/81 |
| 5,828,231 A | 10/1998 | Bazargan .................... 326/81 |
| 5,834,948 A | 11/1998 | Yoshizaki et al. ........... 326/81 |
| 5,892,377 A | 4/1999 | Johnston et al. ........... 327/108 |
| 5,952,847 A | 9/1999 | Plants et al. ................ 326/80 |
| 5,966,030 A | * 10/1999 | Schmitt et al. ............. 326/83 |
| 6,031,394 A | * 2/2000 | Cranford et al. ............ 326/81 |
| 6,040,729 A | * 3/2000 | Sanchez et al. ............ 327/309 |
| 6,118,301 A | 9/2000 | Singh et al. ................ 326/58 |

* cited by examiner

Primary Examiner—Don Le
(74) Attorney, Agent, or Firm—Christopher P. Maiorana, P.C.

(57) ABSTRACT

An apparatus comprising a first circuit configured to generate a first portion of an output signal in response to (i) a first supply voltage and (ii) a pullup signal and a second circuit configured to generate a second portion of said output signal in response to (i) a second supply voltage and (ii) a pulldown signal, wherein said first and second circuits are implemented with transistors that normally can only withstand said second supply voltage.

20 Claims, 2 Drawing Sheets

HIGH VOLTAGE OUTPUT BUFFER USING LOW VOLTAGE TRANSISTORS

FIELD OF THE INVENTION

The present invention relates to a method and/or architecture for implementing a high voltage output buffer generally and, more particularly, to a method and/or architecture for implementing a high voltage output buffer with low voltage transistors.

BACKGROUND OF THE INVENTION

Traditional output buffer circuits have used high voltage transistors for implementing I/Os on the same integrated circuit (IC) as low voltage transistors. Such an approach increases the technology complexity as well as the cost of implementing such a circuit.

For dual-voltage technologies, the I/Os run off a high voltage supply and the internal circuitry off a low voltage supply. Due to gate-oxide stress, low voltage transistors cannot be used in the I/Os with conventional circuits.

As transistor dimensions decrease, supply voltages have to decrease in order to prevent gate-oxide breakdown. However, in order to reduce die cost and improve performance, it is often desirable to migrate a high voltage device into a technology which is smaller, but cannot cope with the gate-oxide stress of the high voltage. A way to avoid this problem is to develop a dual voltage technology. The internals of the chip use the low voltage transistors running off a regulated power supply. The I/Os use high voltage transistors running off the high voltage main supply.

It would be desirable to implement a method and/or architecture that uses low-voltage transistors for an output buffer arranged such that the gate oxide (Gox) is not stressed above the low-voltage threshold.

SUMMARY OF THE INVENTION

The present invention concerns an apparatus comprising a first circuit and a second circuit. The first circuit may be configured to generate a first portion of an output signal in response to (i) a first supply voltage and (ii) a pullup signal. The second circuit may be configured to generate a second portion of said output signal in response to (i) a second supply voltage and (ii) a pulldown signal. The first and second circuits may be implemented with transistors that normally can only withstand the second supply voltage.

The objects, features and advantages of the present invention include providing a method and/or architecture for implementing a high voltage output buffer comprising low voltage transistors that may (i) have a maximum voltage stress across gate oxide that is within the tolerance of low voltage transistors, (ii) provide an integral voltage translation from an internal low voltage stage to a high voltage output stage, (iii) be driven from a high voltage supply; and/or (iv) contain integral voltage translation from internal low voltage to external high voltage.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
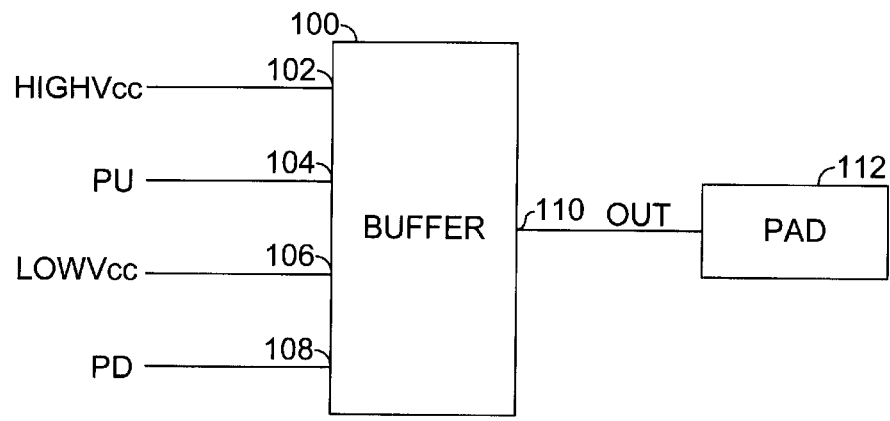
FIG. 1 is a block diagram of a preferred embodiment of the present invention.

Referring to FIG. 1, a block diagram of a circuit 100 is shown in accordance with a preferred embodiment of the present invention. In one example, the circuit 100 may be implemented as a buffer circuit. More specifically, the circuit 100 may be implemented as an output buffer circuit. The circuit 100 may be implemented as a high voltage (e.g., 3.3V) output buffer that only requires low voltage (e.g., 2.5V) transistors. The circuit 100 may have an input 102 that may receive a first supply voltage (e.g., HIGHVCC), an input 104 that may receive a control signal (e.g., PU), an input 106 that may receive a second supply voltage (e.g., LOWVCC), an input 108 that may receive a control signal (e.g., PD) and an output 110 that may present a signal (e.g., OUT) to a pad block (or circuit) 112. The supply voltage HIGHVCC may be at a higher voltage level than the supply voltage LOWVCC. In one example, the signal PU may be implemented as a pullup signal and the signal PD may be implemented as a pulldown signal. The pad circuit 112 may provide an interface to the lead frame of an integrated circuit.

Figure 2:
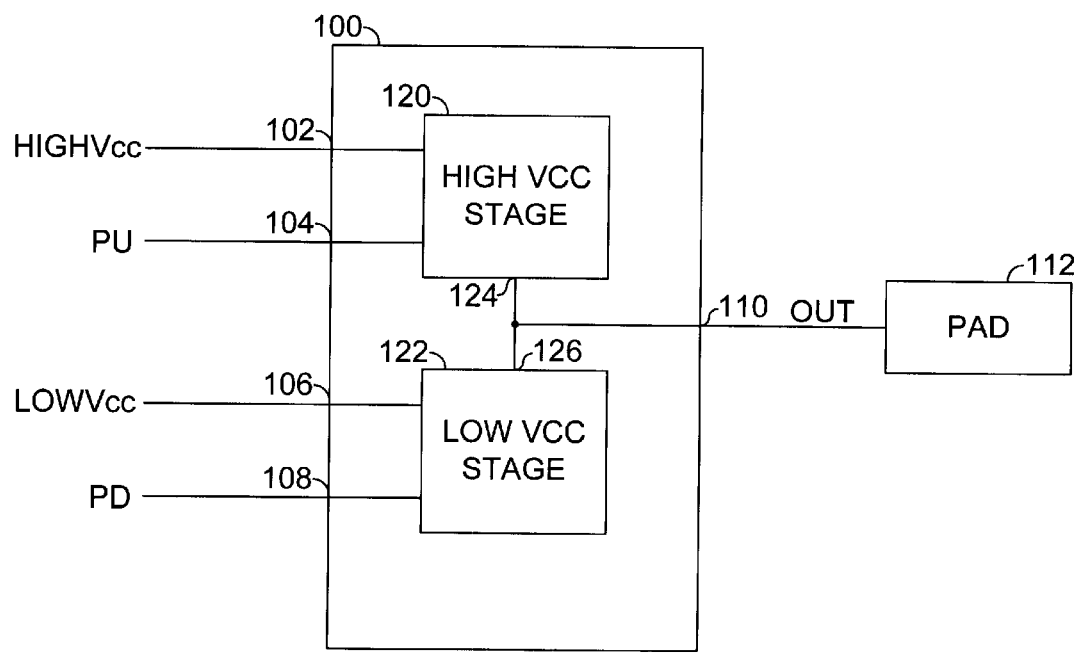
FIG. 2 is a more detailed block diagram of the circuit of FIG. 1.

Referring to FIG. 2, a more detailed diagram of the circuit 100 is shown. The circuit 100 generally comprises a circuit 120 and a circuit 122. The circuit 120 may be a high supply voltage stage. The circuit 122 may be a low supply voltage stage. The circuit 120 generally receives the signal HIGHVCC and the signal PU. The circuit 122 generally receives the signal LOWVCC and the signal PD. An output 124 of the circuit 120 is combined with an output 126 of the circuit 122 to present the signal OUT to the output 110.

Figure 3:
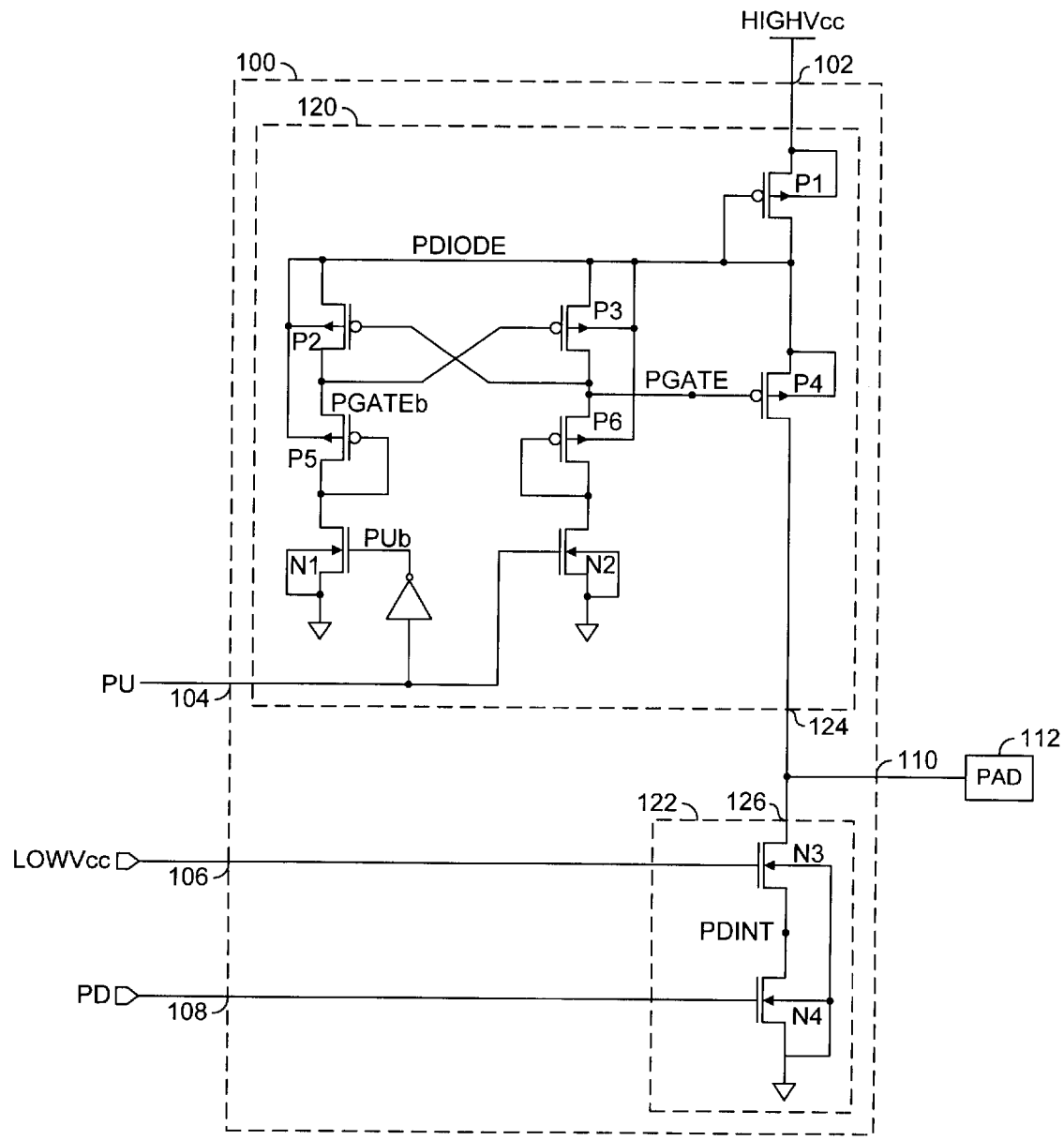
FIG. 3 is a schematic diagram of the circuits of FIGS. 1 and 2.

Referring to FIG. 3, a schematic diagram of the circuit 100 is shown. The circuit 120 generally comprises a transistor P1, a transistor P2, a transistor P3, a transistor P4, a transistor P5, a transistor P6, a transistor N1 and a transistor N2. The transistors P1–P6 are generally implemented as p-channel (or PMOS) transistors. The transistors N1 and N2 are generally implemented as n-channel (or NMOS) transistors. The signal PU is generally presented (i) to an inverter 130 and (ii) directly to the gate of the transistor N2. The inverter 130 may present a signal (e.g., PUb) to the gate of the transistor N1. A source of the transistor P1 generally receives the signal HIGHVCC. A drain of the transistor P4 is generally presented at the output 124.

The gate of the transistor P3 is generally connected between the drain of the transistor P2 and the source of the transistor P5. The connection is generally referred to as a node (e.g., PGATEB). The gate of the transistor P2 is generally connected to the gate of the transistor P4 as well as to the drain of the transistor P3 and the source of the transistor P6. The connection is generally referred to as a node (e.g., PGATE). The source of the transistor P2 and the source of the transistor P3 are generally connected to the gate of the transistor P1 as well as to the source of the transistor P4. This connection is referred to as a node (e.g., PDIODE).

The circuit 122 generally comprises a transistor N3 and a transistor N4. The transistors N3 and N4 are generally implemented as n-channel (or NMOS) transistors. A gate of the transistor N3 generally receives the supply voltage LOWVCC. A gate of the transistor N4 generally receives the signal PD. A node between the transistor N3 and N4 will be referred to as an internal pulldown voltage (e.g., PDINT). The source of the transistor N3 generally presents the output 126.

The following description assumes a 3.3V supply using 2.5V transistors. However, other supply voltages may be implemented accordingly to meet the design criteria of a particular implementation. The p-channel threshold voltage is Vtp=−0.8V, the n-channel threshold voltage is Vtn=0.8V and the gate oxide breakdown is Gox>2.5V.

The circuit 122 generally comprises a pulldown structure implemented using cascaded NMOS devices N3 and N4. The device N3 has a gate driven by the internal low voltage supply LOWVCC (e.g., 2.5V). The device N3 is permanently on when the circuit 100 is powered up. A maximum gate-substrate voltage stress of 2.5V occurs when the pad 122 is driven to 0V, since the device N3 is operating at 2.5V. When the pad 122 is driven to 3.3V, the gate-drain voltage stress is 0.8V When the pulldown signal PD is low, the pull-down device N4 is off. The Gox stress is 0V between gate and substrate. The node PDINT can generally only rise to 2.5V maximum due to the device N3. Therefore, the maximum stress across the drain of the transistor N4 is 2.5V. When the pulldown signal PD is high, the device N4 is on and the node PDINT is pulled low. The gate-drain and gate-substrate stress on the device N4 are both 2.5V. Since the gate voltage of 2.5V is above the threshold voltage Vtn of the device N4, no voltage translation is required.

In the circuit 120, the device P1 provides a diode drop from the 3.3V supply (e.g., the supply HIGHVCC). The device P1 may be implemented as a number of devices greater than 1. Implementing more devices may lessen the impact of the level translator. The device P2 and the devices P5 and P6 are generally implemented in a latch configuration. Such a configuration reduces the voltage on the node PDIODE to Vcc−Vtp, or 2.5V in this example. The device P4 is used to implement the pull-up device. The gate of the device P4 (e.g., PGATE) is controlled by a cross-coupled latch formed by the devices P2 and P3 which also incorporates a voltage translation stage.

When the pull-up device P4 is off, the signal PU is low, ensuring the device N2 is off. If the signal PUb is high, the device N1 is turned on. Due to the PMOS device P5, the node PGATE is pulled to Vss+Vtp, or 0.8V in this example. The voltage may turn on the device P3 and the node PGATE is pulled to 2.5V. The device P2 and the device P4 now have 0V gate to source voltages and are therefore off. As the node PGATEb approaches 0.8V, the gate-source and gate-substrate voltage stress on the device P3 is restricted to 1.7V.

If the pad 112 is pulled to ground when the pull-up device P4 is off, the node PGATE is at 2.5V and the gate-drain stress on the device P4 is 2.5V. When the PAD 112 is pulled high, the device P4 is high and the signal PU low. The device N1 is then off and the device N2 on. Due to the PMOS device P6, the node PGATE is pulled to Vss+Vtp (0.8V in this example). This restricts the gate-source and gate-substrate stress on the device P4 to 1.7V. When the node PGATE is low, the device P2 is on, the device P3 is off and the node PGATE is at 2.5V. The gate-source and gate-substrate stress on the device P2 is then restricted to 1.7V.

The circuit 100 provides integral voltage translation from the internal low voltage stage 122 to the high voltage output stage 120. Specifically, the circuit 100 may contain integral voltage translation from internal low voltage to external high voltage. The circuit 100 may be implemented as a high voltage output buffer that uses low voltage transistors. The circuit 100 may use low-voltage transistors arranged in such a way that the voltage stress across the gate-oxide is within low-voltage transistor tolerances, thus preventing gate oxide Gox breakdown. Therefore, the circuit 100 may be driven from a high voltage supply. Additionally, the circuit 100 may allow maximum voltage stress across gate oxide may be limited to within low voltage transistor tolerance.

The supply voltage HIGHVCC and LOWVCC may be implemented as a variety of voltages. For example, the supply voltage HIGHVCC may be 3.3 V and the supply voltage LOWVCC may be 2.5 V. In another example, the voltage could be scaled down so that the supply voltage HIGHVCC is 2.5 V and the supply voltage LOWVCC is 1.8 V. While not as useful, the voltage could be scaled up so that the supply voltage HIGHVCC is 5.0 V and the supply voltage LOWVCC is 3.3 V. Additionally, 3.3 V high and 1.8 V low could add more diodes.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a first circuit comprising (A) a first pullup transistor and a second pullup transistor and (B) a voltage translation stage coupled between a pullup signal and a node between said first and second pullup transistors, said first circuit configured to generate a first portion of an output signal in response to (i) a first supply voltage and (ii) said pullup signal; and a second circuit configured to generate a second portion of said output signal in response to (i) a second supply voltage and (ii) a pulldown signal, wherein said first and second circuits are implemented with transistors that normally use said second supply voltage.

2. The apparatus according to claim 1, wherein said first circuit comprises a pullup circuit.

3. The apparatus according to claim 1, wherein said second circuit comprises a pulldown circuit.

4. The apparatus according to claim 1, wherein said first supply voltage comprises a first voltage level higher than a second voltage level of said second supply voltage.

5. The apparatus according to claim 1, wherein a maximum voltage stress across a gate oxide of each of said transistors of each of said first and second circuits is within low voltage transistor tolerance.

6. The apparatus according to claim 1, wherein said apparatus is configured to provide an integral voltage translation from an internal low voltage stage to an external high voltage.

7. The apparatus according to claim 1, wherein said voltage translation stage comprises a plurality of low-voltage transistors arranged to limit a voltage stress across a gate-oxide of each of said plurality of low voltage transistors to be substantially within low-voltage transistor tolerances.

8. The apparatus according to claim 1, wherein said apparatus is configured to substantially prevent gate oxide breakdown of said first and second circuits.

9. The apparatus according to claim 1, wherein:

said second circuit comprises one or more transistors configured to control said second portion of said output signal.

10. The apparatus according to claim 1, wherein:

said first circuit comprises a high voltage stage circuit having a first one or more p-channel devices and a first one or more n-channel devices configured to control said first portion of said output signal in response to said first supply voltage and said pullup signal; and said second circuit comprises a low voltage stage circuit having a second one or more n-channel devices configured to control said second portion of said output signal in response to said second supply voltage and said pulldown signal.

11. The apparatus according to claim 1, wherein:

said first circuit comprises a first one or more p-channel devices and a first one or more n-channel devices, wherein said one or more first p-channel devices are cross-coupled and in series with said first one or more n-channel devices; and said second circuit comprises a second one or more n-channel devices coupled in a series configuration, wherein at least one of said first one or more p-channel devices or n-channel devices are coupled to said output signal and at least one of said second one or more n-channel devices are coupled to said output signal.

12. An apparatus comprising:

means for generating a first portion of an output signal in response to (i) a first supply voltage and (ii) a pullup signal using a first pullup transistor and a second pullup transistor;

means for translating said pullup signal according to said first supply voltage; and means for generating a second portion of said output signal in response to (i) a second supply voltage and (ii) a pulldown signal, wherein said first and second circuits are implemented with transistors that normally can only withstand said second supply voltage.

13. A method of buffering a high voltage with transistors that normally can only withstand a low voltage, comprising the steps of:

(A) receiving a first supply voltage and a pullup signal;

(B) receiving a second supply voltage and a pulldown signal;

(C) generating a first portion of an output signal in response to said first supply voltage and said pullup signal using a first pullup transistor and a second pullup transistor;

(D) translating said pullup signal according to said first supply voltage using a plurality of transistors coupled between (a) a node between said first and second transistors and (b) said pullup signal; and (E) generating a second portion of said output signal in response to said second supply voltage and said pulldown signal.

14. The method according to claim 13, further comprising the step of:

limiting a gate-substrate voltage of steps (C), (D) and (E).

15. The method according to claim 13, further comprising the step of:

providing integral voltage translation from an internal low voltage to an external high voltage.

16. The method according to claim 13, wherein step (C) further comprises:

latching one or more voltages to provide a voltage translation stage.

17. The method according to claim 13, wherein step (C) further comprises controlling a first one or more devices in response to said pullup signal and step (E) further comprises controlling a second one or more devices in response to said pulldown signal.

18. The method according to claim 13, wherein step (C) further comprises controlling (i) a positive one or more devices and (ii) a negative one or more devices in response to said pullup signal.

19. The method according to claim 13, further comprising:

restricting a gate-source voltage and a gate-substrate voltage in response to said pullup signal and said pulldown signal.

20. The method according to claim 13, further comprising:

limiting a voltage stress to within low-voltage transistor tolerances.

* * * * *